US006858453B1

(12) United States Patent
Corisis et al.

(10) Patent No.: US 6,858,453 B1
(45) Date of Patent: Feb. 22, 2005

(54) INTEGRATED CIRCUIT PACKAGE ALIGNMENT FEATURE

(75) Inventors: David J. Corisis, Meridian, ID (US); Tracy Reynolds, Boise, ID (US); Michael Slaughter, Boise, ID (US); Daniel Cram, Boise, ID (US); Leland R. Nevill, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/416,368

(22) Filed: Oct. 12, 1999

Related U.S. Application Data

(63) Continuation of application No. 08/929,843, filed on Sep. 15, 1997, now Pat. No. 6,048,744.

(51) Int. Cl.[7] .................. G01R 31/26; H01L 21/66; H01L 21/00; H01L 21/44; H01L 21/48
(52) U.S. Cl. .................. 438/15; 438/106; 438/112; 438/123; 438/127
(58) Field of Search .................. 438/15, 106, 123, 438/127, 112

(56) References Cited

U.S. PATENT DOCUMENTS

| | | | |
|---|---|---|---|
| 2,752,580 A | | 6/1956 | Shewmaker |
| 3,568,001 A | | 3/1971 | Straus |
| 3,678,385 A | | 7/1972 | Bruner |
| 3,882,807 A | | 5/1975 | Montgomery |
| 3,932,934 A | | 1/1976 | Lynch et al. |
| 4,066,839 A | * | 1/1978 | Cossutta et al. ............ 174/52.2 |
| 4,095,253 A | * | 6/1978 | Yoshimura et al. ......... 257/796 |
| 4,142,286 A | | 3/1979 | Knuth et al. |
| 4,514,750 A | * | 4/1985 | Adams ....................... 257/670 |
| 4,528,747 A | | 7/1985 | Hoffman et al. |
| 4,589,010 A | * | 5/1986 | Tateno et al. ............... 257/670 |
| 4,689,875 A | * | 9/1987 | Solstad ........................ 29/827 |
| 4,701,781 A | * | 10/1987 | Sankhagowit ............... 257/671 |
| 4,722,135 A | | 2/1988 | Read |
| 4,733,462 A | | 3/1988 | Kawatani |
| 4,801,997 A | * | 1/1989 | Ono et al. .................. 257/670 |
| 4,810,154 A | | 3/1989 | Klemmer et al. |
| 4,841,100 A | | 6/1989 | Ignasiak |
| 4,940,181 A | | 7/1990 | Juskey, Jr. et al. |
| 4,958,214 A | | 9/1990 | Ries et al. |
| 4,961,107 A | * | 10/1990 | Geist et al. ................. 257/675 |
| 4,967,262 A | * | 10/1990 | Farnsworth ................. 257/678 |
| 4,975,079 A | | 12/1990 | Beaman et al. |
| 4,985,107 A | | 1/1991 | Conroy et al. |

(List continued on next page.)

FOREIGN PATENT DOCUMENTS

JP 07-302860 A 11/1995

OTHER PUBLICATIONS

Puttlitz et al., "C–4/CBGA Comparison with Other MLC Single Chip Package Alternatives," *IEEE Transactions on Components, Packaging, and Manufacturing Technology*, May 1995, pps. 250–256, Part B, vol. 18, No. 2.

(List continued on next page.)

*Primary Examiner*—David E. Graybill
(74) *Attorney, Agent, or Firm*—TraskBritt

(57) ABSTRACT

An integrated circuit is provided having an alignment feature integral with the lead frame. The integrated circuit includes a lead frame coupled with a semiconductor die, and is partially encapsulated in insulating material. The lead frame has the alignment feature therein. The alignment feature includes a cut out on the lead frame taking the form of a semicircle, protuberance, apertures, or slots. Alternatively, the alignment feature includes a removably coupled tab. After testing of the integrated circuit has been completed, the alignment tab is removed from the integrated circuit. The alignment feature can also be provided on a heat spreader which is attached to a side of or within the lead frame package.

12 Claims, 9 Drawing Sheets

U.S. PATENT DOCUMENTS

| | | | |
|---|---|---|---|
| 5,006,792 A | 4/1991 | Malhi et al. | |
| 5,034,802 A | 7/1991 | Liebes, Jr. et al. | |
| 5,051,339 A | 9/1991 | Friedrich et al. | |
| 5,051,813 A | 9/1991 | Schneider et al. | |
| 5,056,216 A | 10/1991 | Madou et al. | |
| 5,074,036 A | 12/1991 | Dunaway et al. | |
| 5,114,880 A * | 5/1992 | Lin | 438/107 |
| 5,117,330 A | 5/1992 | Miazga | |
| 5,150,194 A * | 9/1992 | Brooks et al. | 257/670 |
| 5,155,905 A | 10/1992 | Miller, Jr. | |
| 5,164,818 A | 11/1992 | Blum et al. | |
| 5,189,507 A | 2/1993 | Carlomagno et al. | |
| 5,203,075 A | 4/1993 | Angulas et al. | |
| 5,228,862 A | 7/1993 | Baumberger et al. | |
| 5,236,118 A | 8/1993 | Bower et al. | |
| 5,255,431 A | 10/1993 | Burdick | |
| 5,313,015 A | 5/1994 | Hoge | |
| 5,327,008 A * | 7/1994 | Djennas et al. | 257/666 |
| 5,329,423 A | 7/1994 | Scholz | |
| 5,337,219 A | 8/1994 | Carr et al. | |
| 5,349,235 A * | 9/1994 | Lee et al. | 257/693 |
| 5,349,236 A | 9/1994 | Oshino et al. | |
| 5,350,713 A | 9/1994 | Liang | |
| 5,352,851 A * | 10/1994 | Wallace et al. | 174/52.4 |
| 5,369,550 A | 11/1994 | Kwon | |
| 5,376,010 A | 12/1994 | Petersen | |
| 5,378,924 A | 1/1995 | Liang | |
| 5,400,220 A | 3/1995 | Swamy | |
| 5,403,671 A | 4/1995 | Holzmann | |
| 5,413,970 A * | 5/1995 | Russell | 29/827 |
| 5,426,405 A | 6/1995 | Miller et al. | |
| 5,435,482 A | 7/1995 | Variot et al. | |
| 5,435,732 A | 7/1995 | Angulas et al. | |
| 5,442,852 A | 8/1995 | Danner | |
| 5,446,960 A | 9/1995 | Isaacs et al. | |
| 5,453,581 A | 9/1995 | Liebman et al. | |
| 5,459,287 A | 10/1995 | Swamy | |
| 5,463,191 A | 10/1995 | Bell et al. | |
| 5,468,991 A * | 11/1995 | Lee et al. | 257/666 |
| 5,477,086 A | 12/1995 | Rostocker et al. | |
| 5,477,933 A | 12/1995 | Nguyen | |
| 5,521,427 A | 5/1996 | Chia et al. | |
| 5,521,428 A | 5/1996 | Hollingsworth et al. | |
| 5,526,974 A | 6/1996 | Gordon et al. | |
| 5,528,461 A | 6/1996 | Gore et al. | |
| 5,530,291 A | 6/1996 | Chan et al. | |
| 5,530,295 A * | 6/1996 | Mehr | 257/796 |
| 5,555,488 A * | 9/1996 | McLellan et al. | 361/820 |
| 5,556,293 A | 9/1996 | Pfaff | |
| 5,578,870 A | 11/1996 | Farnsworth et al. | |
| 5,611,705 A | 3/1997 | Pfaff | |
| 5,637,008 A | 6/1997 | Kozel | |
| 5,637,919 A | 6/1997 | Grabbe | |
| 5,639,323 A | 6/1997 | Jordan | |
| 5,643,835 A * | 7/1997 | Chia et al. | |
| 5,646,447 A | 7/1997 | Ramsey et al. | |
| 5,669,774 A | 9/1997 | Grabbe | |
| 5,688,127 A | 11/1997 | Staab et al. | |
| 5,691,041 A | 11/1997 | Frankeny et al. | |
| 5,702,255 A | 12/1997 | Murphy et al. | |
| 5,714,792 A * | 2/1998 | Przano | |
| 5,716,222 A | 2/1998 | Murphy | |
| 5,726,502 A | 3/1998 | Beddingfield | |
| 5,728,601 A * | 3/1998 | Sato et al. | 438/109 |
| 5,730,606 A | 3/1998 | Sinclair | |
| 5,751,556 A | 5/1998 | Butler et al. | |
| 5,761,036 A | 6/1998 | Hopfer et al. | |
| 5,766,978 A | 6/1998 | Johnson | |
| 5,767,580 A | 6/1998 | Rostoker | |
| 5,770,891 A | 6/1998 | Frankeny et al. | |
| 5,773,321 A * | 6/1998 | Ishikawa et al. | 438/109 |
| 5,793,618 A | 8/1998 | Chan et al. | |
| 5,796,590 A | 8/1998 | Klein | |
| 5,797,177 A | 8/1998 | Simmons et al. | |
| 5,861,654 A | 1/1999 | Johnson | |
| 5,861,669 A * | 1/1999 | Sono et al. | 257/696 |
| 5,892,245 A | 4/1999 | Hilton | |
| 5,936,849 A | 8/1999 | Fetterman | |
| 5,947,751 A | 9/1999 | Massingill | |
| 5,949,137 A | 9/1999 | Domadia et al. | |
| 5,955,888 A | 9/1999 | Frederickson et al. | |
| 5,978,229 A | 11/1999 | Kim | |
| 5,982,027 A | 11/1999 | Corisis | |
| 5,983,477 A | 11/1999 | Jacks et al. | |
| 5,986,885 A * | 11/1999 | Wyland | 361/704 |
| 6,007,357 A | 12/1999 | Perino et al. | |
| 6,018,249 A | 1/2000 | Akram et al. | |
| 6,026,566 A | 2/2000 | Urban et al. | |
| 6,028,350 A | 2/2000 | Sabyeying | |
| 6,036,503 A | 3/2000 | Tsuchida | |
| 6,037,667 A | 3/2000 | Hembree et al. | |
| 6,040,618 A | 3/2000 | Akram | |
| 6,042,387 A | 3/2000 | Jonaidi | |
| 6,048,744 A * | 4/2000 | Corisis et al. | |
| 6,084,781 A | 7/2000 | Klein | |
| 6,169,323 B1 * | 1/2001 | Sakamoto | 257/667 |
| 6,198,172 B1 | 3/2001 | King et al. | |
| 6,242,817 B1 | 6/2001 | Grande et al. | |
| 6,297,960 B1 | 10/2001 | Moden et al. | |
| 6,389,688 B1 | 5/2002 | Srivastava et al. | |
| 6,420,195 B1 * | 7/2002 | King et al. | 438/14 |
| 6,518,098 B2 * | 2/2003 | Corisis | 438/122 |
| 6,548,827 B2 | 4/2003 | Irie | |
| 2001/0046127 A1 | 11/2001 | Matsumura | |

OTHER PUBLICATIONS

Goldmann, Lewis S., "Statistical Model for the Inherent Tilt of Flip–Chips," *Transactions of the ASME Journal of Electronic Packaging*, Mar. 1996, pps. 16–20, vol. 118.

Nasiatka et al., "Determination of Optimal Solder Volume for Precision Self–Alignment of BGA using Flip–Chip Bonding," pps. 6–9.

* cited by examiner

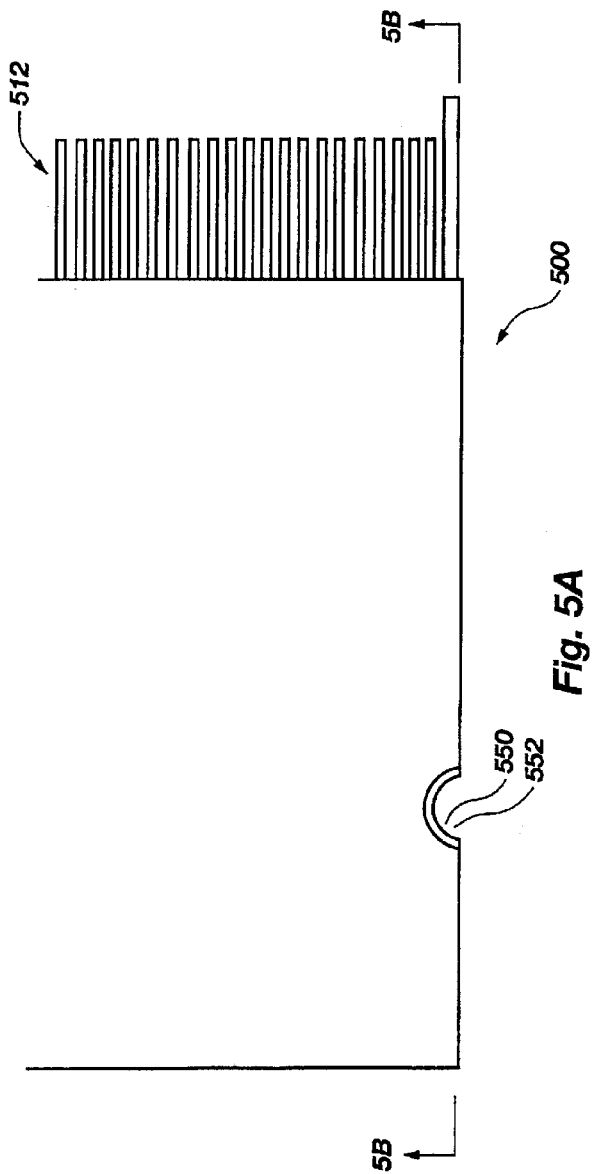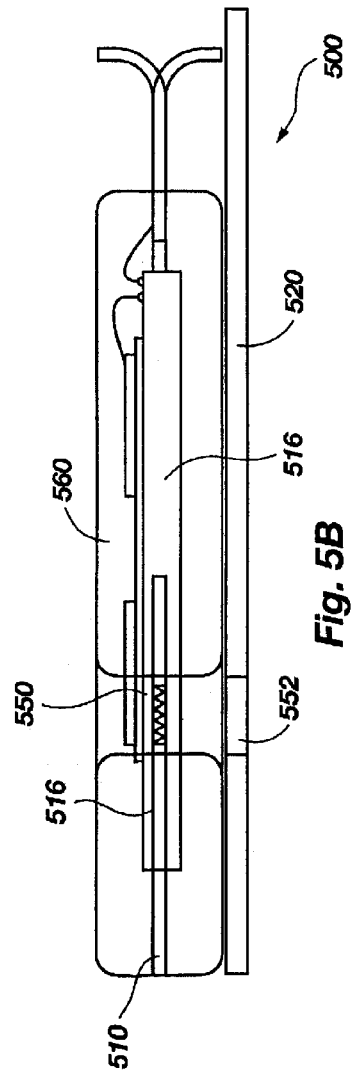

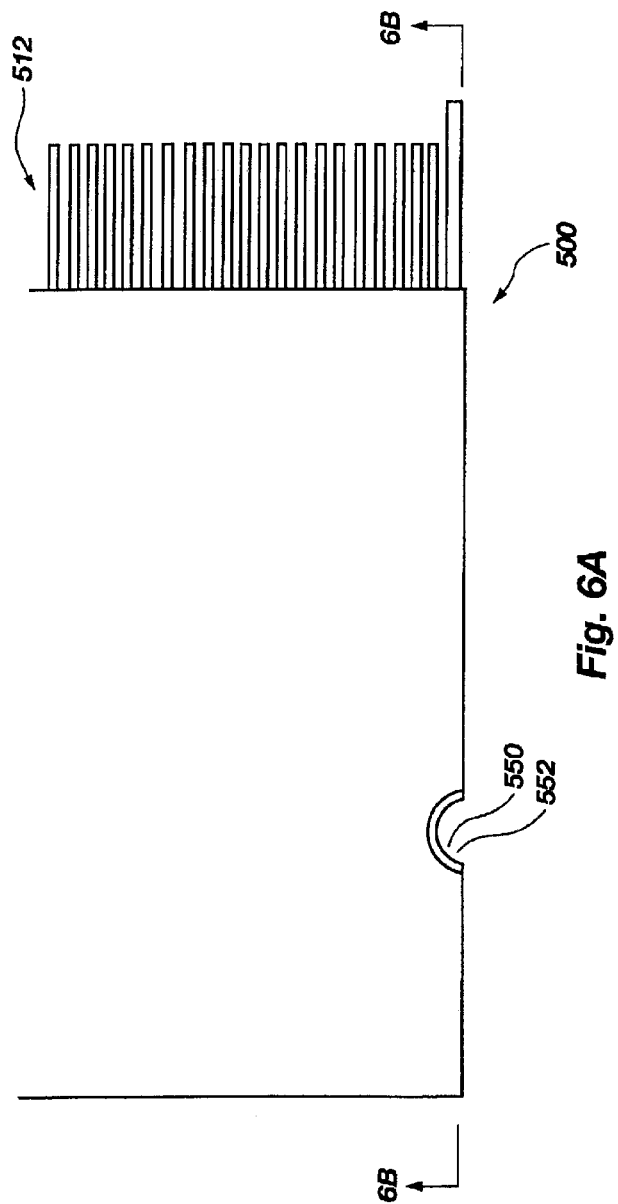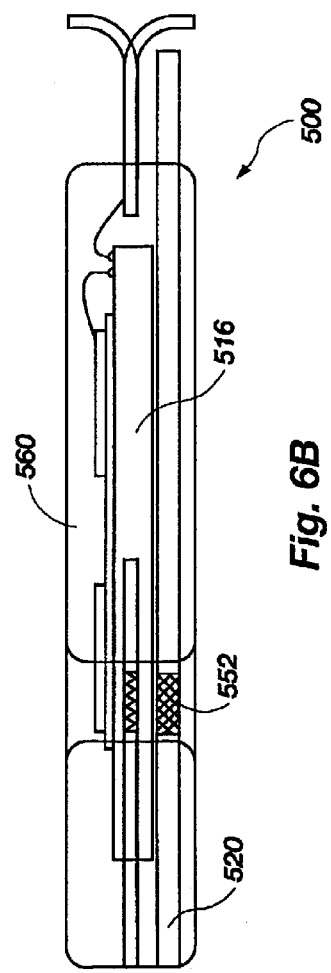

INTEGRATED CIRCUIT PACKAGE ALIGNMENT FEATURE

CROSS-REFERENCE TO RELATED APPLICATION

This application is a continuation of application Ser. No. 08/929,843, filed Sep. 15, 1997, now U.S. Pat. No. 6,048,744, issued Apr. 11, 2000.

BACKGROUND OF THE INVENTION

1. Field of the Invention

The present invention relates generally to integrated circuits. More particularly, it pertains to alignment features for integrated circuit packages.

2. State of the Art

Photolithography and etching are two methods used to fabricate integrated circuits. In photolithography, hundreds of dice are manufactured from a single wafer. After the dice are formed on the wafer, the wafer is segmented into individual units and encapsulated to form a set of packaged integrated circuits.

A percentage of integrated circuits are defective. Some of these parts have defects from the manufacturing process. Others will malfunction within a short period of use. These imperfect integrated circuits are infant mortalities. It is important to isolate these infant mortalities so that they can be discarded prior to sale. The integrated circuit devices are tested using hot and cold conditions to stress the devices and to sort out failures. One step in this process of identifying the infant mortalities is burn-in testing.

In the burn-in test process, integrated circuits are subjected to a high level of stressful conditions, including high temperatures and high voltage. During a typical burn-in test, thousands of integrated circuits are inserted in burn-in boards, which allow electrical connectivity to the individual integrated circuits.

After an extended period of time, the integrated circuits are removed from the stressful conditions and are tested to determine if they are defective. During the testing process, a testing assembly is used to contact conductors on the integrated circuit. For proper testing, each contact on the testing assembly must contact the appropriate conductor on the integrated circuit. If a contact on the testing assembly does not accurately touch the corresponding conductor on the integrated circuit, a variety of problems can arise.

During the testing process, contacts of the testing assembly make physical and electrical contact with the conductors of the integrated circuit. If the integrated circuit is not accurately aligned with the testing assembly, the accuracy of the physical contact is jeopardized. Misaligned contacts of the testing assembly can deform the conductors and damage the integrated circuit.

Additionally, misaligned contacts of the testing assembly may not permit sufficient electrical contact between the contacts of the testing assembly and the conductors of the integrated circuit. This results in integrated circuits being falsely flagged as defects and unnecessarily increases production costs. Furthermore, integrated circuits are becoming more complex with more capabilities. As a result, leads on lead frames are being placed closer and closer together, which further complicates accurate testing procedures.

Accordingly, what is needed is a better way to align integrated circuit packages during the testing process.

SUMMARY OF THE INVENTION

The above-mentioned problems with testing of integrated circuits are addressed by the present invention and which will be understood by reading and studying the following specification. An apparatus and method for testing integrated circuits is described which allows for proper alignment of leads from a lead frame during the testing process. Alternatively, the alignment features could be used during other processing steps, such as during the solder reflow process. Advantageously, the apparatus and method permit testing of the integrated circuit with reduced risk of misalignment of and damage to conductors of the lead frame.

A conductive apparatus has an alignment feature integral therewith. In one embodiment, the conductive apparatus comprises a lead frame and the alignment feature comprises an alignment tab. The alignment tab can have a number of shapes, including, but not limited to, generally square or circular shapes. In addition, the alignment tab or tabs can include two or more apertures for additional alignment options. The alignment feature can also comprise a semicircular-shaped cut out on one or more edges of the lead frame. The cut out can be formed in other shapes, such as square or angular shapes.

Alternatively, an integrated circuit is provided which comprises, in part, a lead frame, a semiconductor die coupled with the lead frame, an alignment feature disposed on the lead frame, and insulating material encompassing the die and a portion of the lead frame. The lead frame has a plurality of conductors which extends out of the insulating material. In one embodiment, the alignment feature comprises an alignment tab. The alignment tab can be removably coupled with the lead frame, for instance, with a perforation line. When an integrated circuit manufacturer desires to remove the alignment tab, the tab is folded over the perforation line until the tab is severed from the lead frame.

In another embodiment, the integrated circuit includes a heat spreader thermally coupled with the lead frame. The heat spreader is disposed outside of the insulating material. Alternatively, in another embodiment, at least a portion of the heat spreader is encompassed by the insulating material. The lead frame has a first alignment cut out disposed therein, and the heat spreader has a second alignment cut out disposed therein. The first alignment cut out is aligned with the second alignment cut out.

The present invention also includes a method for forming and testing an integrated circuit package. First, a lead frame having an integral alignment feature, as described above, is provided. A semiconductor die is then coupled with the lead frame. The lead frame is partially encapsulated with insulating material. Then, the integrated circuit is tested by aligning the alignment feature with testing equipment, testing the integrated circuit, and then removing the integrated circuit package from the testing equipment. When removing the integrated circuit package from the testing equipment, the alignment feature, optionally, can be removed from the lead frame.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE SEVERAL VIEWS OF THE DRAWING

In the drawings, where like numerals describe like components throughout the several views:

FIG. 5A is a top plan view illustrating an integrated circuit constructed in accordance with one embodiment of the present invention;

FIG. 5B is a cut away view taken along line 5B—5B of FIG. 5A illustrating an integrated circuit constructed in accordance with one embodiment of the present invention;

FIG. 6A is a top plan view illustrating an integrated circuit constructed in accordance with another embodiment of the present invention;

FIG. 6B is a cut away view taken along line 6B—6B of FIG. 6A illustrating an integrated circuit constructed in accordance with one embodiment of the present invention;

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural changes may be made without departing from the spirit and scope of the present invention. Therefore, the following detailed description is not to be taken in a limiting sense, and the scope of the present invention is defined by the appended claims.

After the fabricated silicon wafers reach assembly, the dice are then carried through a number of steps to become individual units in leaded packages. After packaging, tests are performed to ensure that the system meets timing requirements and no defects have occurred during the packaging process and/or burn-in. The testing process can include testing at several temperatures to assure performance specifications are met. For each process, it is significant to have the proper alignment of conductors of the lead frames with the testing assembly.

Figure 1:
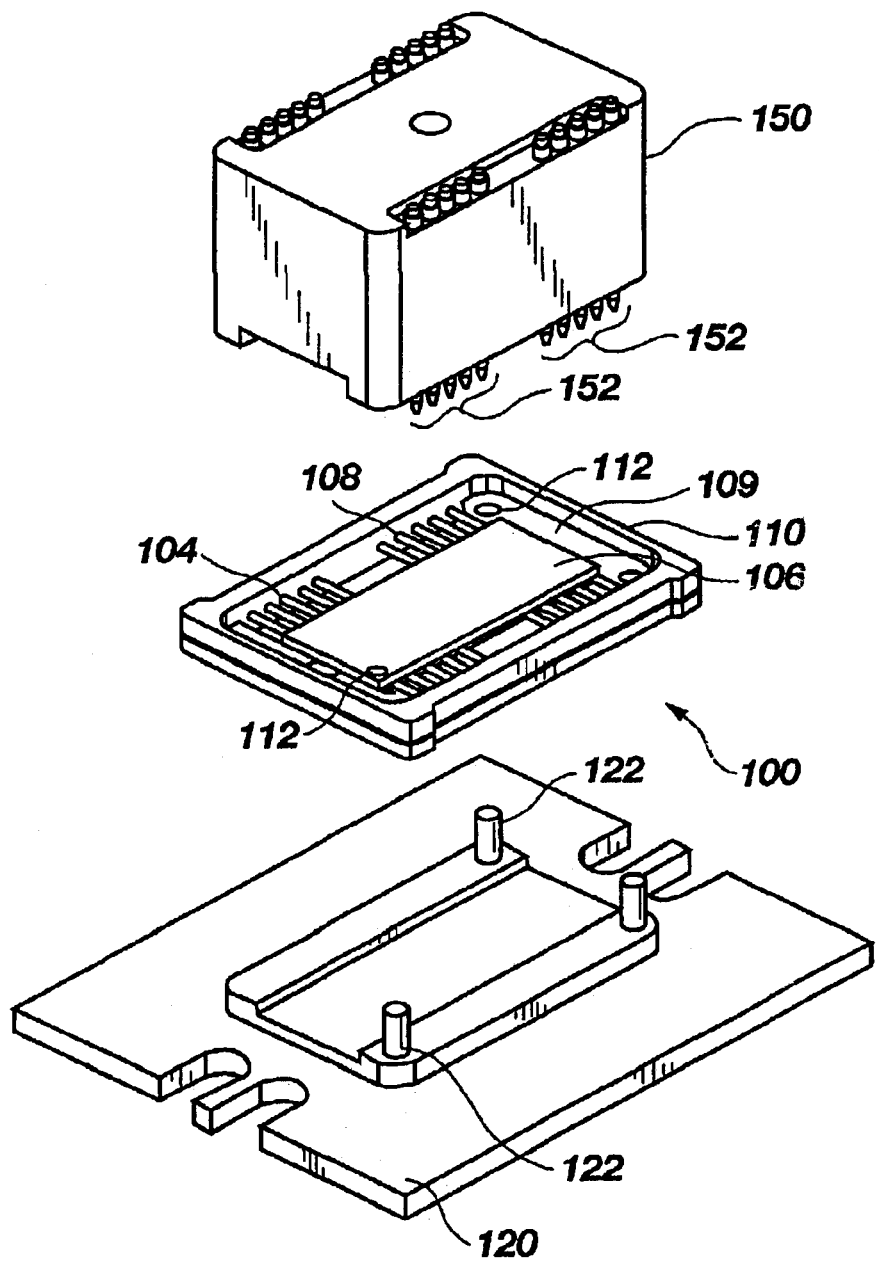
FIG. 1 is an exploded perspective view illustrating a conventional alignment feature and testing devices used therewith.

FIG. 1 illustrates a prior art testing device and alignment feature of an integrated circuit. For testing an integrated circuit 100, a test assembly 150 is provided. The test assembly 150 has a plurality of test contactors 152. The test contactors 152 provide the electrical connection between the test assembly 150 and the integrated circuit 100.

The integrated circuit 100 is shown prior to a trim and form stage. The integrated circuit 100 includes a lead frame 108 and a semiconductor die (not shown). Conductors 104 of the lead frame 108 extend from plastic packaging 106 to a molded carrier ring 110. Prior to the trim and form stage, the lead frame 108 also has a lead frame rail 109. The lead frame rail 109 has a plurality of apertures 112 therein. The apertures 112 are used to align the integrated circuit 100 with the test assembly 150 during the test process. The placement of the apertures 112 is such that they are aligned with the alignment pins 122.

A tray insert 120 is provided with alignment pins 122 which extend up from the tray insert 120. The alignment pins 122 are inserted through the apertures 112 of the lead frame rail 109, which assist in aligning the conductors 104 of the integrated circuit 100 with the test contactors 152 of the test assembly 150. The test assembly 150 automatically contacts the integrated circuit 100 during the testing process. During manufacture, the lead frame 108 is formed in a lead frame strip. Using a molded carrier ring 110, the density of the lead frame strip is only 6–8 units per strip. If the molded carrier ring 110 is removed from each lead frame 108, 12 units can be provided on the lead frame strip. However, if the molded carrier ring 110 is removed from the above-discussed lead frames, the lead frames must be aligned using the plastic packaging. Aligning the lead frames using the plastic packaging is difficult since the tolerance of the plastic packaging 106 relative to the lead frame 108 is high. Since individual conductors 104 of the lead frame 108 are being placed closer and closer together, and given the high tolerance of the plastic packaging 106, the integrated circuit 100 is not always in proper alignment with the test assembly 150. This approach results in bent leads and inaccurate alignment of the integrated circuits with the testing equipment due to the high tolerance stack-up.

Figure 2:
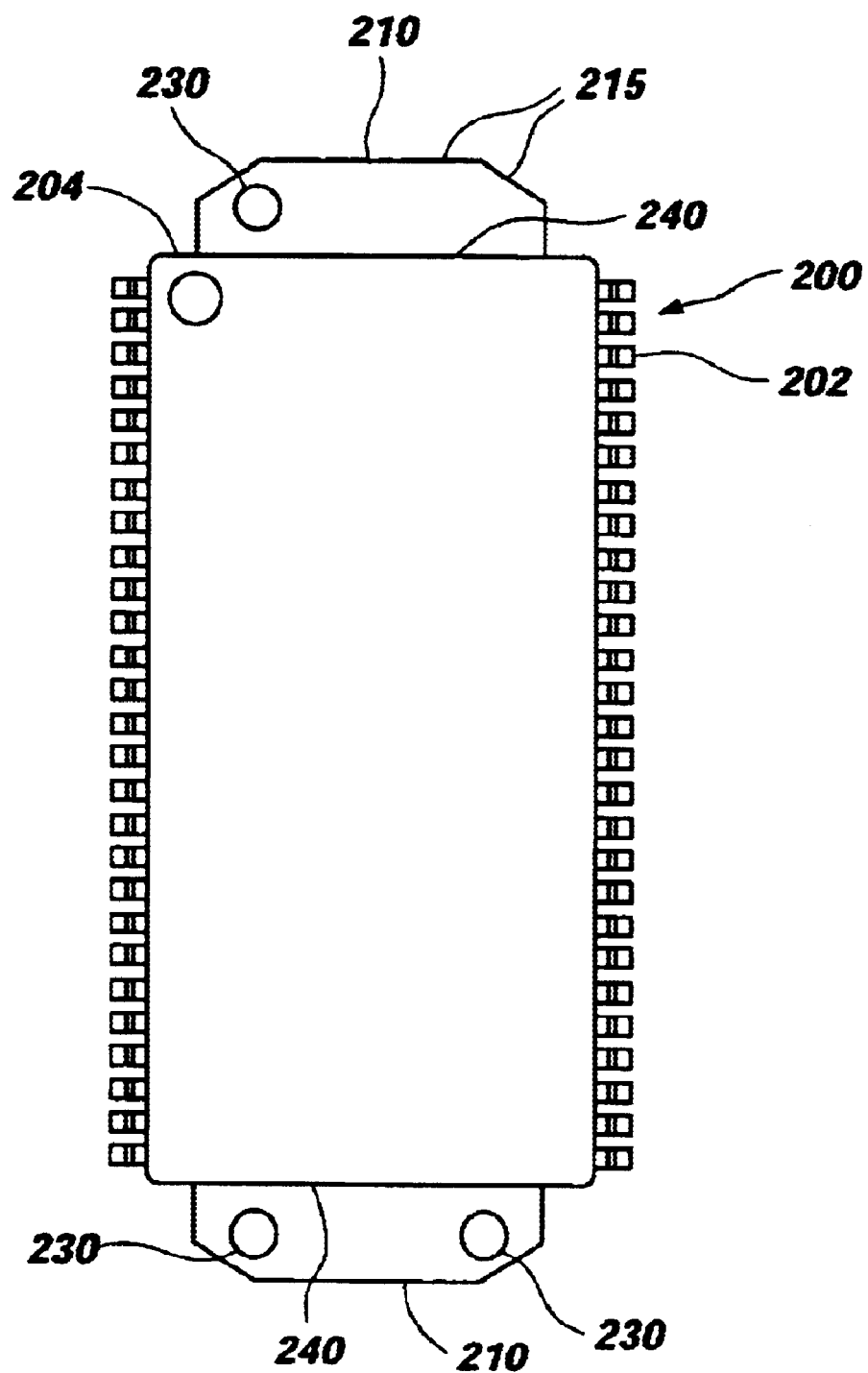
FIG. 2 is a top plan view illustrating an integrated circuit constructed in accordance with one embodiment of the present invention.

As illustrated in FIG. 2, the present invention provides an alignment tab 210 on a lead frame 200. In another embodiment, a plurality of alignment tabs 210 is provided. The lead frame 200 has a plurality of conductors 202, where the conductors 202 are not connected by a rail or outside frame (not shown), which are generally used during the encapsulation process. The alignment tab 210 is disposed on a first side 204 of the lead frame 200 and extends from the first side 204 to a length for coupling with a receiving member on testing equipment. The shape of the alignment tab 210 corresponds to the shape of the receiving member, such that the alignment tab 210 is received therein. In one embodiment, the alignment tab 210 has a plurality of flat surfaces 215. Alternatively, the alignment tab 210 could have other constructions, such as generally or substantially curved or square shaped (FIG. 7), or others having multiple flat surfaces.

In another embodiment, the alignment tab 210 has an aperture 230. The aperture 230 is sized and placed to mate with another aligning member on the testing equipment. Alternatively, a plurality of apertures 230 is provided on the alignment tab 210. The apertures 230 could also take on other shapes and sizes which are considered within the scope of the invention.

In yet another embodiment, the alignment tab 210 is removably coupled with the lead frame 200. A separation line 240 is disposed between the lead frame 200 and the alignment tab 210. The separation line 240 could be a perforated line (e.g., see perforated line 451 of FIG. 4B), a fold line, or other types of structure or lines of weakness which permit removal of the alignment tab 210 from the lead frame 200. A technician can then remove the alignment tab by folding the alignment tab 210 over the separation line 240. The alignment tab 210 is folded, repeatedly, if necessary, over the separation line 240 until the alignment tab 210 is severed or broken away from the lead frame 200. A cutting device could be used to remove the alignment tab 210 from the lead frame 200. A fixture for holding the cutting device could also be used to facilitate removal of the alignment tab 210.

Figure 3:
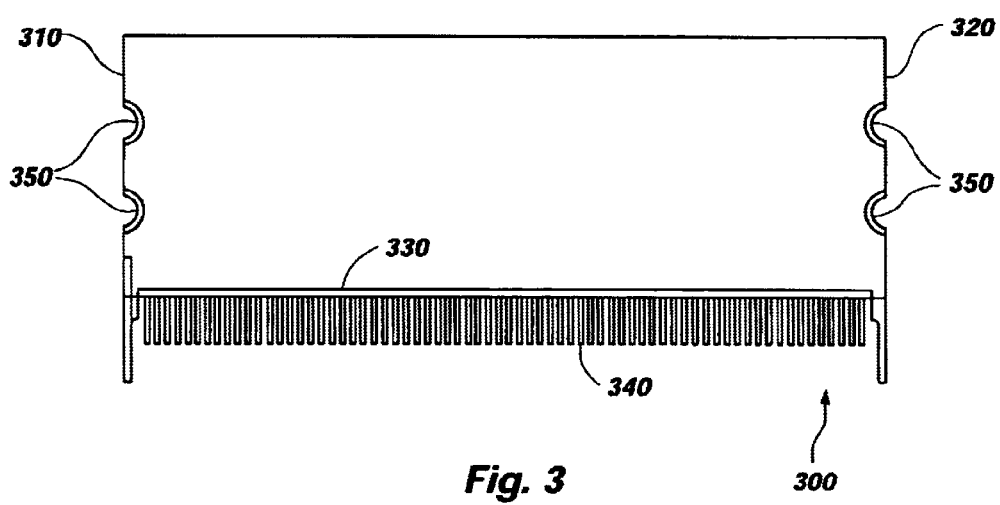
FIG. 3 is a top plan view illustrating an integrated circuit constructed in accordance with one embodiment of the present invention.

FIG. 3 illustrates another embodiment of the alignment feature for a vertical surface mount package (VSMP). A conductive apparatus has a first side 310, a second side 320, and a third side 330. In one embodiment, the conductive apparatus comprises a lead frame 300. A plurality of conductors 340 extends from the third side 330. The first side 310 and the second side 320 each have at least one alignment cut out 350 therein. Alternatively, the alignment cut out 350 could be provided on a single side of the lead frame 300. The lead frame 300 in one embodiment has four alignment cut outs 350. The lead frame 300, alternatively, could have two or more alignment cut outs 350. The alignment cut out 350 is sized large enough that the plastic of the packaging process, including mold flash, will not significantly overlap the alignment cut out 350. In one embodiment, the alignment cut out 350 is a half circle having a radius of 0.030 inch and positioned 0.010 inch away from either the first side 310 or the second side 320. Alternatively, the alignment cut out 350 could have other shapes and sizes such as holes, slots, etc. and yet still be considered within the scope of the present invention. In yet another embodiment, the alignment feature could be a protuberance formed on one of the sides of the lead frame 300 (such as protuberance 450' shown in FIG. 4B). It is desirable that the position of the alignment feature is such that the features do not interfere with mold gates and vents, yet such that package performance and internal lead positioning is acceptable.

Figure 4A:
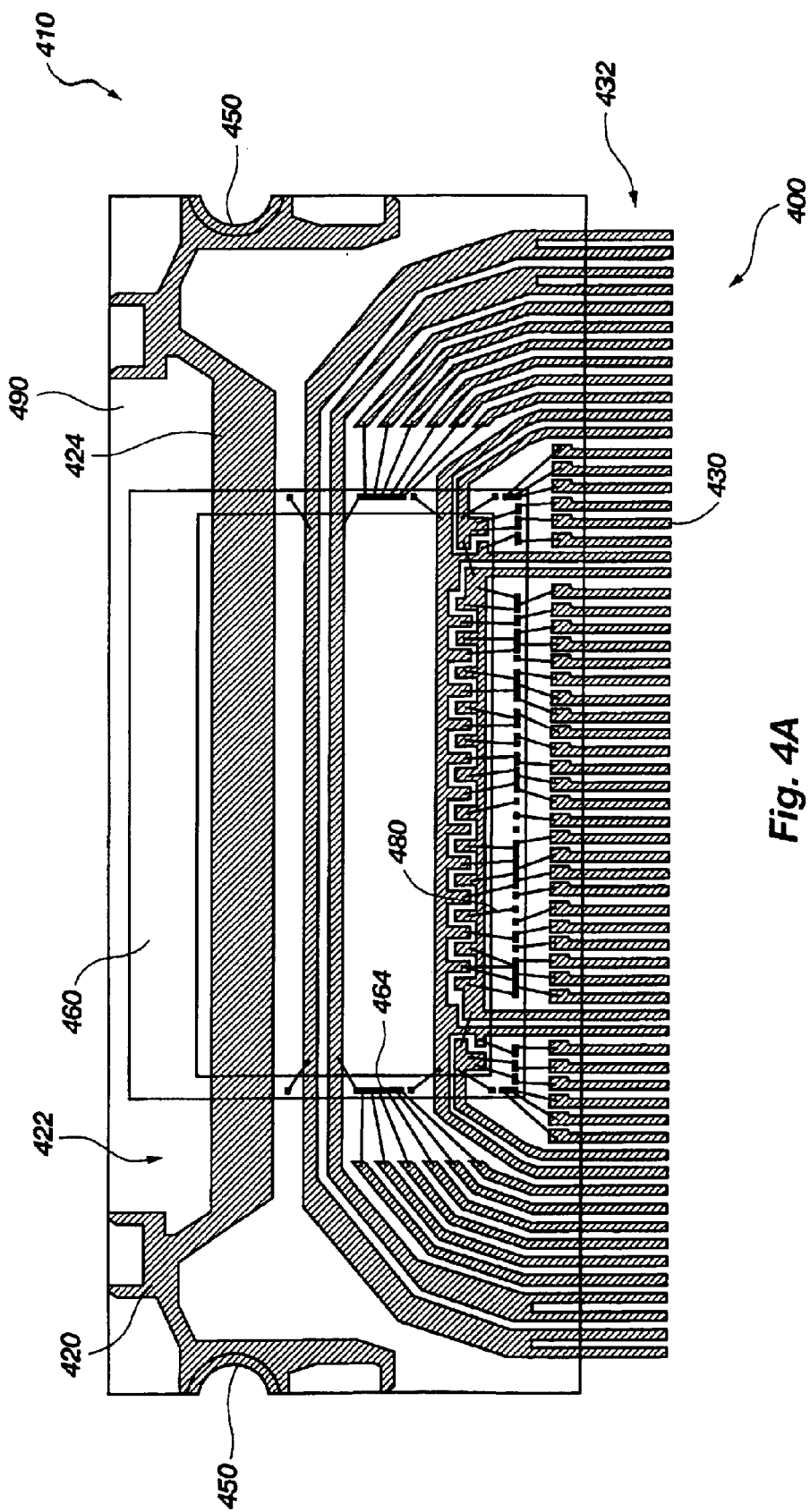
FIG. 4A is a top plan view illustrating an integrated circuit constructed in accordance with another embodiment of the present invention.
Figure 4B:
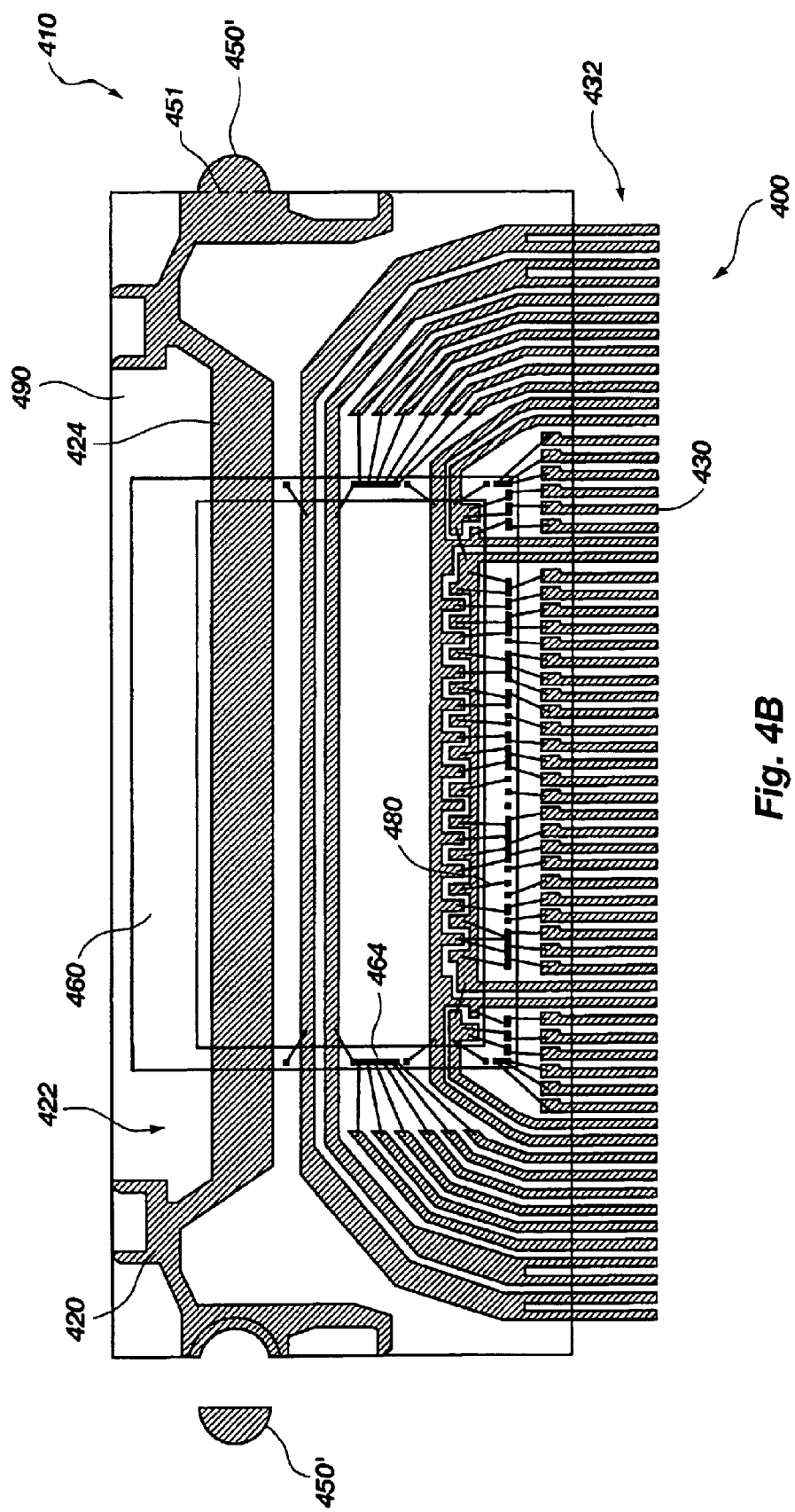
FIG. 4B is a top plan view illustrating an integrated circuit constructed in accordance with yet another embodiment of the present invention.

FIGS. 4A and 4B illustrate additional embodiments of the present invention. A VSMP integrated circuit 400 is provided with a lead frame 420 having alignment features 410. The lead frame 420 has leads 430 and an alignment portion 422. The alignment portion 422 includes a tie bar 424 and also other parts of the lead frame 420 which provide internal support to the integrated circuit package. However, the alignment portion 422 does not include outer rails (not shown) or an outer frame (not shown) which are used during the encapsulation process. The lead frame 420 may include alignment cut outs 450 (FIG. 4A) or alignment protuberances 450' (FIG. 4B) integral therewith, disposed within the alignment portion 422. The alignment cut outs 450 and protuberances 450' are sized large enough such that mold flash from encapsulation, discussed below, will not interfere with nor fill in the alignment cut out 450. In one embodiment, the alignment cut out 450 has a semicircular shape. Alternatively, other shapes could be used for the alignment cut out 450. As previously noted, in one embodiment the protuberances 450' may be removable along a perforation 451 or other line of weakness if so desired.

A semiconductor die 460 includes circuitry formed thereon. A plurality of bond pads 464 is formed around the periphery of the die 460. The semiconductor die 460 is mounted to the lead frame 420 using leads over chip (LOC) methods, as is known in the art. Electrically conductive wire bonding 480 is used to connect selected bond pads 464 on the die 460 to selected leads 430 or conductors of the lead frame 420.

In one embodiment, the lead frame 420, semiconductor die 460, and wire bonding 480 are enclosed in protective, electrically insulative material such that ends 432 of the leads 430 are exposed to allow connection to be made to other electrical components. In another embodiment, the above components are encapsulated in plastic 490, thereby forming an integrated circuit package.

FIG. 5A and 5B illustrate another embodiment. An integrated circuit 500 has a lead frame 510 and a semiconductor die 516 encapsulated by packaging 560. A heat spreader 520, disposed outside of the packaging 560, is thermally coupled with the integrated circuit 500. Alternatively, in another embodiment illustrated in FIGS. 6A and 6B, the heat spreader 520 is disposed substantially or partially within the packaging 560. Although a heat spreader is described, other devices which dissipate heat could be incorporated.

Referring to FIGS. 5A, 5B, 6A and 6B, a first alignment cut out 550 is disposed in the lead frame 510. The first alignment cut out 550 has a generally circular shape, although other shapes are contemplated. The heat spreader 520 has a second alignment cut out 552. The second alignment cut out 552 has substantially the same shape as the first alignment cut out 550. In addition, the second alignment cut out 552 is aligned with the first alignment cut out 550. The first and second alignment cut outs 550, 552 are sized and located to mate with a test apparatus such that conductors 512 of the lead frame 510 are sufficiently aligned with contacts on the test assembly and the test contacts. Having the alignment feature on the lead frame 510 permits accurate alignment of the conductors 512 and the test contacts.

Figure 7:
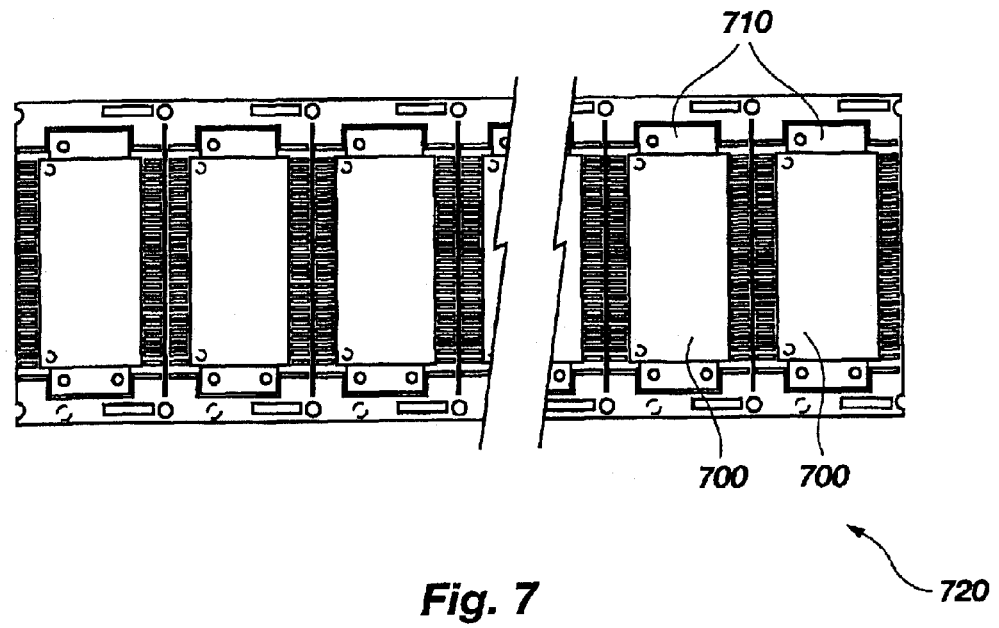
FIG. 7 is a top plan view illustrating a plurality of integrated circuits constructed in accordance with another embodiment of the present invention.

In another embodiment illustrated in FIG. 7, lead frames 700 and their respective alignment features 710 are formed from a single sheet of material or a thin strip that is etched or stamped into a predetermined shape for connection with a selected chip design. After encapsulation of the lead frame strip 720 in plastic, portions of the lead frame extend out of the respective chip packages to be cut, trimmed, and formed for mounting onto a printed circuit board.

Figure 9:
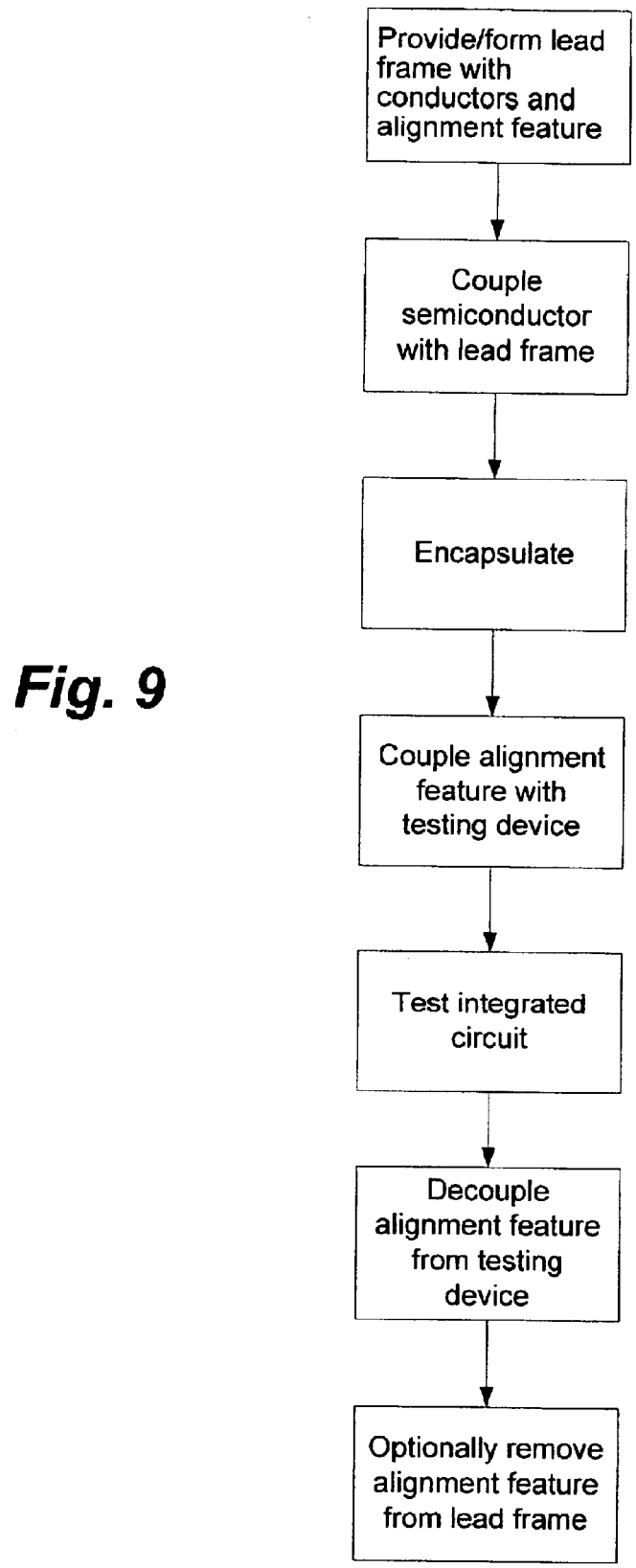
FIG. 9 is a flow chart indicating an exemplary method of forming and testing an integrated circuit in accordance with an embodiment of the present invention.

A method for testing integrated circuits, such as set forth in FIG. 9 includes providing an integrated circuit with the above-discussed alignment features. The alignment features, described in detail above, are used to mate with the testing equipment. For the embodiments illustrated in FIGS. 2 and 7, the alignment tab is aligned with a mating orifice on the testing equipment. For the embodiments illustrated in FIGS. 3-6, the alignment cut out on the lead frame is aligned with a projection on the testing equipment. The alignment features on the lead frame of the present invention are aligned with corresponding structure on the testing equipment.

Figure 8:
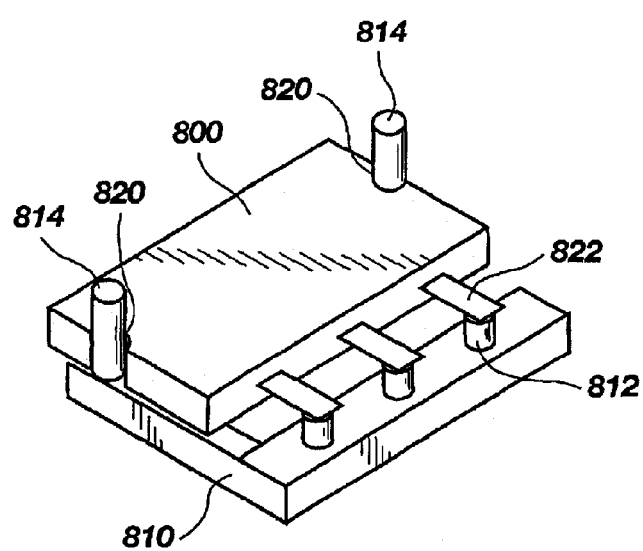
FIG. 8 is a perspective view illustration a testing device and an integrated circuit constructed in accordance with one embodiment of the present invention.

FIG. 8 illustrates one example of an integrated circuit 800 and a testing device 810 of the present invention during the testing process and which may be utilized in conjunction with the method depicted in FIG. 9. Other configurations of the testing device 810 and the integrated circuit 800 are contemplated by the present invention. The testing device 810 has an alignment structure 814 and test contacts 812. The alignment structure 814 is coupled with an alignment feature 820 of the integrated circuit 800. The alignment structure 814 can take on a number of configurations including, but not limited to, posts, apertures, slots, and projections, depending on the configuration of the alignment feature on the device to be tested. The alignment structure 814 is mechanically coupled with the test contacts 812 such that consistent and proper alignment of the test contacts 812 with the leads 822 can be achieved. Aligning the testing device 810 using the alignment structure 814 and the alignment feature 820 beneficially provides for accurate alignment of the leads 822 of the integrated circuit 800 with test contacts 812.

After testing, a circuit manufacturer or an end product user may wish to remove the alignment tab. To remove the alignment tab 210 shown in FIG. 2, the alignment tab 210 is folded about the separation line 240. The alignment tab 210 is folded back over the separation line 240 until the material connecting the alignment tab 210 to the lead frame 200 is severed or disconnected.

Advantageously, the alignment tabs and the alignment cut outs on the lead frame allow for more precision during alignment of the integrated circuit during testing. The alignment features assist in achieving higher yields after lead conditioning and after testing. During testing, yield loss can occur due to misconnection at test. The alignment features reduce rejects in testing for bent leads caused by improper alignment of the test contacts. The step of retesting of parts failing initial testing due to misalignment is eliminated. The scan time is reduced since the parts can be pre-aligned in the shipping and handling tray. The end user benefits since the parts have built-in alignment features for better placement accuracy. In addition, the built-in features are inexpensive to incorporate into existing designs.

It is to be understood that the above description is intended to be illustrative and not restrictive. Many other embodiments will be apparent to those of skill in the art upon reviewing the above description. For instance, the alignment feature can be incorporated with a variety of packages such as, but not limited to, vertical surface mount packages, horizontal surface mount packages, or through-hole applications. The scope of the invention should, therefore, be determined with reference to the appended claims, along with the full scope of equivalents to which such claims are entitled.

What is claimed is:

1. A method of forming an integrated circuit package, the method comprising:
    forming a lead frame having a plurality of leads and at least one alignment feature distinct from the plurality of leads and configuring the at least one alignment feature for cooperative engagement with a structure external to the integrated circuit package;
    coupling at least some of the plurality of leads to a semiconductor die;
    encapsulating the semiconductor die and a portion of the lead frame with an insulating material;
    electrically isolating the at least one alignment feature from the plurality of leads subsequent the encapsulating the semiconductor die and a portion of the lead frame while maintaining the at least one alignment feature as a part of the integrated circuit package; and
    removing the at least one alignment feature subsequent the electrically isolating the at least one alignment feature from the plurality of leads.

2. A method of forming an integrated circuit package, the method comprising:
    forming a lead frame having a plurality of leads and at least one alignment feature distinct from the plurality of leads and configuring the at least one alignment feature for cooperative engagement with a structure external to the integrated circuit package;
    coupling at least some of the plurality of leads to a semiconductor die; and
    encompassing the semiconductor die, a portion of each of the plurality of leads, and substantially encompassing the at least one alignment feature with an insulating material; and
    electrically isolating the at least one alignment feature from the plurality of leads while maintaining the at least one alignment feature as a part of the integrated circuit package.

3. A method of forming and testing an integrated circuit package, the method comprising:
    forming a lead frame having a plurality of leads and at least one alignment feature distinct from the plurality of leads;
    electrically coupling at least some of the plurality of leads to a semiconductor die;
    encompassing the semiconductor die, a portion of each of the plurality of leads, and substantially encompassing the at least one alignment feature with an insulating material;
    electrically isolating the at least one alignment feature from the plurality of leads while maintaining the at least one alignment feature as a part of the integrated circuit package;
    coupling the at least one alignment feature encompassed by the insulating material with a portion of a testing device; and
    testing the integrated circuit package through at least some of the electrically coupled leads.

4. The method according to claim 1, further comprising forming the at least one alignment feature to include at least one aperture.

5. The method according to claim 1, further comprising forming the at least one alignment feature to include a plurality of apertures.

6. The method according to claim 1, further comprising forming a separation line in the lead frame prior to removal of the at least one alignment feature and wherein removing the at least one alignment feature further comprises removing the at least one alignment feature along the separation line.

7. The method according to claim 6, wherein the forming a separation line in the lead frame includes perforating the separation line.

8. The method according to claim 1, further comprising forming the at least one alignment feature to include a tab protruding from an outer peripheral boundary of the insulating material.

9. A method of forming and testing an integrated circuit package, the method comprising:
    forming a lead frame having a plurality of leads and at least one alignment feature distinct from the plurality of leads;
    coupling at least some of the plurality of leads to a semiconductor die;
    encapsulating the semiconductor die and a portion of the lead frame with an insulating material;
    electrically isolating the at least one alignment feature from the plurality of leads subsequent the encapsulating the semiconductor die and a portion of the lead frame with an insulating material while maintaining the at least one alignment feature as a part of the integrated circuit;
    coupling the at least one alignment feature with a portion of a testing device;
    testing the integrated circuit package through at least some of the electrically coupled leads;
    decoupling the at least one alignment feature from the portion of the testing device; and
    removing the at least one alignment feature subsequent the decoupling the at least one alignment feature from the portion of the testing device.

10. The method according to claim 2, further comprising forming the at least one alignment feature to include an alignment cut-out.

11. The method according to claim 2, further comprising disposing a heat spreader adjacent to, and in contact with, an external surface of the insulating material, forming at least one other alignment feature in the heat spreader and configuring the at least one other alignment feature to substantially correspond in size and share to the at least one alignment feature such that the at least one alignment feature and the at least one other alignment feature form a cooperative alignment structure.

12. The method according to claim 2, further comprising providing a tie bar and forming the at least one alignment feature in the tie bar.

* * * * *

UNITED STATES PATENT AND TRADEMARK OFFICE
CERTIFICATE OF CORRECTION

PATENT NO.        : 6,858,453 B1                                    Page 1 of 1
APPLICATION NO.   : 09/416368
DATED             : February 22, 2005
INVENTOR(S)       : Corisis et al.

It is certified that error appears in the above-identified patent and that said Letters Patent is hereby corrected as shown below:

Column 9, line 9, in Claim 11, delete "share" and insert -- shape --, therefor.

Signed and Sealed this

First Day of April, 2008

JON W. DUDAS
*Director of the United States Patent and Trademark Office*